(12) United States Patent
Jeon

(10) Patent No.: US 8,097,507 B2
(45) Date of Patent: Jan. 17, 2012

(54) METHOD OF FABRICATING A SEMICONDUCTOR DEVICE

(75) Inventor: Kwang Seok Jeon, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 148 days.

(21) Appl. No.: 12/472,216

(22) Filed: May 26, 2009

(65) Prior Publication Data

US 2009/0289296 A1    Nov. 26, 2009

(30) Foreign Application Priority Data

May 26, 2008  (KR) .................. 10-2008-0048628

(51) Int. Cl.
*H01L 21/336* (2006.01)

(52) U.S. Cl. ........ 438/257; 438/264; 438/265; 438/266; 257/E21.681

(58) Field of Classification Search .................. 438/197, 438/257, 261, 264, 265, 266; 257/E21.681
See application file for complete search history.

(56) References Cited

U.S. PATENT DOCUMENTS

| | | | | |
|---|---|---|---|---|
| 5,345,104 A * | 9/1994 | Prall et al. | ...................... | 257/607 |
| 5,429,970 A * | 7/1995 | Hong | ........................... | 438/259 |
| 5,907,188 A * | 5/1999 | Nakajima et al. | ............. | 257/751 |
| 5,953,611 A * | 9/1999 | Tanaka | .......................... | 438/267 |
| 5,962,890 A * | 10/1999 | Sato | ............................... | 257/320 |
| 6,228,712 B1 * | 5/2001 | Kawai et al. | ................... | 438/257 |
| 6,525,367 B1 * | 2/2003 | Moriyama | ..................... | 257/314 |
| 6,620,684 B2 | 9/2003 | Kim et al. | | |
| 6,790,728 B1 * | 9/2004 | Dong et al. | .................... | 438/257 |
| 6,852,595 B2 * | 2/2005 | Yang | .............................. | 438/257 |
| 6,911,740 B2 * | 6/2005 | Chun et al. | .................... | 257/407 |
| 7,154,779 B2 * | 12/2006 | Mokhlesi et al. | ......... | 365/185.01 |
| 7,592,227 B2 * | 9/2009 | Lee et al. | ....................... | 438/265 |
| 7,682,904 B2 * | 3/2010 | Kim et al. | ..................... | 438/260 |
| 2007/0025145 A1* | 2/2007 | Mokhlesi et al. | ......... | 365/185.01 |
| 2009/0212345 A1* | 8/2009 | Lee | ................. | 257/321 |
| 2009/0224307 A1* | 9/2009 | Lee et al. | ....................... | 257/316 |
| 2009/0269939 A1* | 10/2009 | Sprey | .............................. | 438/773 |
| 2010/0081267 A1* | 4/2010 | Purayath et al. | .............. | 438/594 |

FOREIGN PATENT DOCUMENTS

| | | |
|---|---|---|
| KR | 10-2001-0008602 | 2/2001 |
| KR | 10-2006-0101587 | 9/2006 |
| KR | 10-2006-0133166 | 12/2006 |

* cited by examiner

*Primary Examiner* — Evan Pert
(74) *Attorney, Agent, or Firm* — Marshall, Gerstein & Borun LLP

(57) ABSTRACT

A semiconductor device and a method of fabricating the same. In accordance with a method of fabricating a semiconductor device according to an aspect of the invention, a tunnel dielectric layer, a first conductive layer, a dielectric layer, a second conductive layer, and a gate electrode layer are sequentially stacked over a semiconductor substrate. The gate electrode layer and the second conductive layer are patterned. A first passivation layer is formed on sidewalls of the gate electrode layer. Gate patterns are formed by etching the dielectric layer, the first conductive layer, and the tunnel dielectric layer, which have been exposed. A second passivation layer is formed on the entire surface along a surface of the gate patterns including the first passivation layer.

20 Claims, 7 Drawing Sheets

METHOD OF FABRICATING A SEMICONDUCTOR DEVICE

CROSS-REFERENCE TO RELATED APPLICATION

Priority to Korean patent application number 10-2008-0048628, filed on May 26, 2008, the entire disclosure of which is incorporated by reference, is claimed.

BACKGROUND OF THE INVENTION

The invention relates generally to a semiconductor device and a method of fabricating the same and, more particularly, to a semiconductor device in which gate patterns are formed, and a method of fabricating the same.

In general, in a flash memory semiconductor device, a gate pattern is formed by patterning a conductive layer for a floating gate, a dielectric layer, a conductive layer for a control gate, and a gate electrode.

FIG. 1 is a sectional view of a semiconductor device for forming a gate pattern of the device in the prior art.

Referring to FIG. 1, a tunnel dielectric layer 11, a conductive layer for a floating gate 12, a dielectric layer 13, a conductive layer for a control gate 14, a gate electrode layer 15, and a hard mask layer 16 are sequentially stacked over a semiconductor substrate 10. The hard mask layer 16 is patterned, and the gate electrode layer 15 is patterned by an etch process employing the patterned hard mask layer.

Generally, in the case in which a tungsten silicide ($WSi_x$) layer is used as a gate electrode layer in semiconductor devices of 50 nm or less, resistance (Rs) of word lines is increased due to high resistivity of the tungsten silicide ($WS_{ix}$) layer itself and therefore the program and read speeds are lowered. To solve the problems, the thickness of the tungsten silicide ($WSi_x$) layer should be increased. However, this method makes a patterning process of the word lines difficult and void may occur within isolation layers that electrically isolate the word lines. Accordingly, research has been done on a method of forming the gate electrode layer using a tungsten (W) layer having lower resistivity than the tungsten silicide ($WSi_x$) layer.

However, the tungsten layer is easily oxidized by a thermal process and easily corroded or oxidized and dissolved by a cleaning process in a cleaning process. Accordingly, the tungsten layer greatly limits subsequent processes.

BRIEF SUMMARY OF THE INVENTION

The invention is directed to a semiconductor device and a method of fabricating the same, wherein in a process of forming a gate pattern of a semiconductor device, a gate electrode layer is patterned and a passivation layer is formed on sidewalls of the gate electrode layer to prevent the sidewalls of the gate electrode layer from being exposed, so that etch damage of the gate electrode layer at the time of a subsequent gate pattern etch process and etch damage at the time of a cleaning process can be prevented and device failure can be decreased.

A semiconductor device according to a first embodiment of the invention includes gate patterns in each of which a tunnel dielectric layer, a conductive layer for a floating gate, a dielectric layer, a conductive layer for a control gate, and a gate electrode layer are sequentially stacked over a semiconductor substrate, a first passivation layer formed on sidewalls of the gate electrode layer, and a second passivation layer formed on the entire surface along a surface of the first passivation layer and the gate patterns.

The semiconductor device preferably further includes a third passivation layer formed between the surface of the first passivation layer and the gate patterns, and the second passivation layer.

A semiconductor device according to a second embodiment of the invention includes gate patterns in each of which a tunnel dielectric layer, a conductive layer for a floating gate, a dielectric layer, a conductive layer for a control gate, and a gate electrode layer are sequentially stacked over a semiconductor substrate, a first passivation layer formed on sidewalls of the gate electrode layer, and a second passivation layer formed on a surface of the first passivation layer and over the gate patterns.

The first passivation layer preferably comprises an oxide layer or a nitride layer. The second passivation layer preferably comprises a high-temperature oxide (HTO) layer, a low-pressure tetraethyl orthosilicate (LP-TEOS) layer or an atomic layer deposition (ALD) oxide layer.

According to a method of fabricating a semiconductor device in accordance with a first embodiment of the invention, a tunnel dielectric layer, a first conductive layer, a dielectric layer, a second conductive layer, and a gate electrode layer are sequentially stacked over a semiconductor substrate. The gate electrode layer and the second conductive layer are patterned. A first passivation layer is formed on sidewalls of the gate electrode layer. Gate patterns are formed by etching the dielectric layer, the first conductive layer, and the tunnel dielectric layer, which have been exposed. A second passivation layer is formed on the entire surface along a surface of the gate patterns including the first passivation layer.

Before the gate patterns are formed, a cleaning process preferably is performed to remove byproducts occurring upon patterning of the gate electrode layer and the second conductive layer.

The cleaning process preferably is performed using a wet or dry cleaning process employing HF, $NH_4OH$ or $H_2SO_4$, either alone or in combination.

The first passivation layer preferably is formed by an oxidization process, a nitrification process, or a nitride layer deposition process.

The oxidization process preferably is performed using $O_2$ or $H_2$ gas, either alone or in combination and preferably is performed by further adding an inert gas such as $N_2$ or Ar gas. The nitrification process preferably is performed using $NH_3$ gas, $N_2$ gas, NO gas, or $NO_2$ gas, or a combination with an inert gas.

The second passivation layer preferably is formed from an HTO layer, an LP-TEOS layer, or an ALD oxide layer. The HTO layer preferably is formed using a mixed gas of silane-based gas, such as $SiH_4$ gas, $Si_2H_6$ gas, or $SiH_2Cl_2$ gas, and $O_2$ gas.

According to a method of fabricating a semiconductor device in accordance with a second embodiment of the invention, a tunnel dielectric layer, a first conductive layer, a dielectric layer, a second conductive layer, and a gate electrode layer are sequentially stacked over a semiconductor substrate. The gate electrode layer and the second conductive layer are patterned. A first passivation layer is formed on sidewalls of the gate electrode layer. A second passivation layer is formed on the entire surface including the first passivation layer. Gate patterns are formed by etching the second passivation layer formed over the dielectric layer, the dielectric layer, the first conductive layer, and the tunnel dielectric layer.

Before the gate patterns are formed, a cleaning process preferably is performed to remove byproducts occurring upon patterning of the gate electrode layer and the second conductive layer.

The cleaning process preferably is performed using a wet or dry cleaning process employing HF, NH$_4$OH or H$_2$SO$_4$, either alone or in combination.

The first passivation layer preferably is formed by an oxidization process, a nitrification process, or a nitride layer deposition process. The oxidization process preferably is performed using O$_2$ gas or H$_2$ gas, either alone or in combination and preferably is performed by further adding an inert gas such as N$_2$ gas or Ar gas. The nitrification process preferably is performed using NH$_3$, N$_2$, NO, NO$_2$ gas, or a combination thereof with an inert gas.

The second passivation layer preferably is formed from an HTO layer, an LP-TEOS layer, or an ALD oxide layer. The HTO layer preferably is formed using a mixed gas of silane-based gas, such as SiH$_4$ gas, Si$_2$H$_6$ gas, or SiH$_2$Cl$_2$ gas, and O$_2$ gas.

According to a method of fabricating a semiconductor device in accordance with a third embodiment of the invention, a tunnel dielectric layer, a first conductive layer, a dielectric layer, a second conductive layer, and a gate electrode layer are sequentially stacked over a semiconductor substrate. The gate electrode layer and the second conductive layer are patterned. A first passivation layer is formed on sidewalls of the gate electrode layer. Gate patterns are formed by etching the dielectric layer, the first conductive layer, and the tunnel dielectric layer, which have been exposed. Second and third passivation layers are formed on the entire surface along a surface of the gate patterns including the first passivation layer.

Before the gate patterns are formed, a cleaning process preferably is performed to remove byproducts occurring upon patterning of the gate electrode layer and the second conductive layer.

The cleaning process preferably is performed using a wet or dry cleaning process employing HF, NH$_4$OH or H$_2$SO$_4$, either alone or in combination.

The first passivation layer preferably is formed by a nitrification process, which is performed using NH$_3$ gas, N$_2$ gas, NO gas, or NO$_2$ gas, or a combination thereof with an inert gas.

The first passivation layer preferably is formed by an oxidization process, which is performed using O$_2$ gas or H$_2$ gas, either alone or in combination and is performed by further adding an inert gas such as N$_2$ gas or Ar gas.

The third passivation layer preferably is formed from an HTO layer, an LP-TEOS layer, or an ALD oxide layer.

The HTO layer preferably is formed using a mixed gas of silane-based gas, such as SiH$_4$, Si$_2$H$_6$ or SiH$_2$Cl$_2$, and O$_2$ gas.

DESCRIPTION OF SPECIFIC EMBODIMENTS

Figure 1:
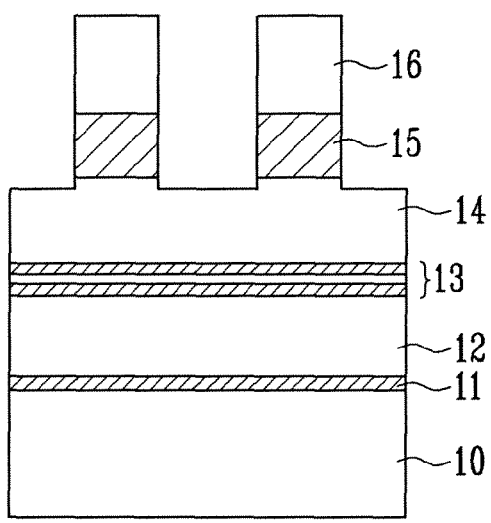
FIG. 1 is a sectional view of a semiconductor device for forming a gate pattern of the device in the prior art.

Hereinafter, the invention is described in detail in connection with specific embodiments with reference to the accompanying drawings. The disclosed embodiments are provided to complete the disclosure of the invention and to allow those having ordinary skill in the art to understand the scope of the invention. When it is said that any part, such as a layer, film, area, or plate, is positioned on another part, it means the part is directly on the other part or above the other part with at least one intermediate part. To clarify multiple layers and regions, the thickness of the layers is enlarged in the drawings.

Figure 2A:
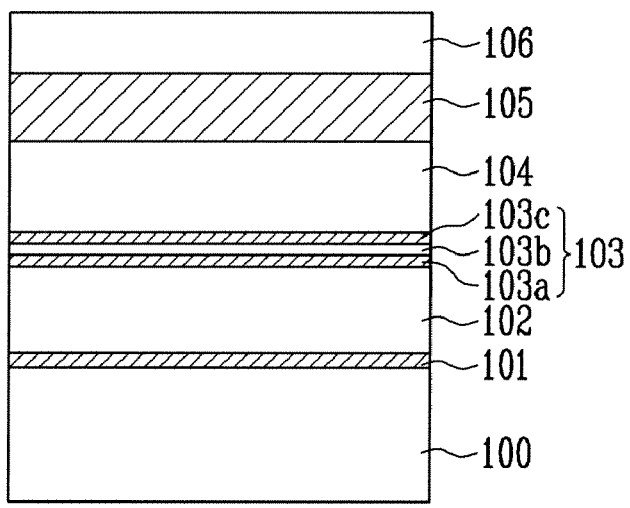
FIGS. 2A to 2C are sectional views illustrating a method of fabricating a semiconductor device in accordance with a first embodiment of the invention.
Figure 2B:
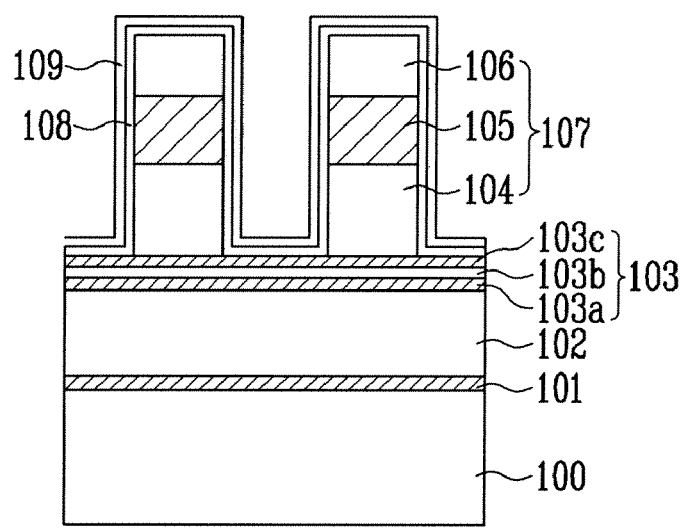
Figure 2C:
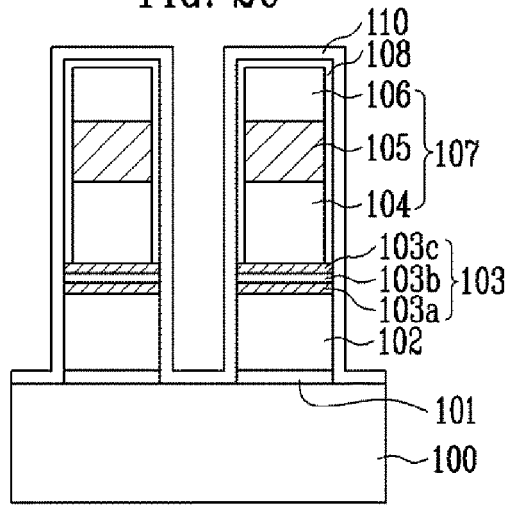

FIGS. 2A to 2C are sectional views illustrating a method of fabricating a semiconductor device in accordance with a first embodiment of the invention.

Referring to FIG. 2A, a tunnel dielectric layer 101, a conductive layer for a floating gate 102, a dielectric layer 103, a conductive layer for a control gate 104, a gate electrode layer 105, and a hard mask layer 106 are sequentially stacked over a semiconductor substrate 100.

The conductive layer for the floating gate 102 and the conductive layer for the control gate 104 may be formed from a polysilicon layer, and the dielectric layer 103 preferably has an ONO structure comprising a first oxide layer 103$a$, a nitride layer 103$b$, and a second oxide layer 103$c$. The gate electrode layer 105 may be formed from a tungsten (W) layer.

The conductive layer for the floating gate 102 is formed from a dual layer, preferably including an amorphous polysilicon layer not containing an impurity and a polysilicon layer containing an impurity.

Although not shown in the drawings, after the conductive layer for the control gate 104 is formed, a diffusion-prevention layer may be formed before the gate electrode layer 105 is formed.

Referring to FIG. 2B, after a photoresist pattern is formed on the hard mask layer 106, an etch process employing the photoresist pattern is performed. That is, the hard mask layer 106 is patterned.

The gate electrode layer 105 and the conductive layer for the control gate 104 are patterned by an etch process employing the patterned hard mask layer 106 as an etch mask, thereby forming primary gate patterns 107.

An oxidization process is then performed to form a first passivation layer 108 on the entire surface including the primary gate patterns 107. The oxidization process preferably is performed using O$_2$ or H$_2$ gas, or a combination thereof. It may be preferred that etch-damaged portions be cured while not oxidizing the exposed gate electrode layer 105 by further adding an inert gas of N$_2$ or Ar gas. The first passivation layer 108 preferably is formed from a nitride layer using a nitride layer deposition process instead of the oxidization process. A sacrificial layer 109 is formed on the entire surface including the first passivation layer 108. The sacrificial layer 109 preferably is formed from a polysilicon layer. The sacrificial layer 109 functions to prevent the first passivation layer 108 from being etched in a subsequent etch process of the dielectric layer 103. The sacrificial layer 109 preferably is formed using SiH$_4$, Si$_2$H$_6$, Si$_2$HCl$_2$, NH$_3$, N$_2$, Ar, He or PH$_3$ gas, preferably in a pressure range of 0.05 Torr to 760 Torr. Further, the sacrificial layer 109 may be formed using a Laminar type in which the sacrificial layer 109 and the first passivation layer 108 are stacked alternately.

Next, a cleaning process may be performed to remove byproducts, which occur in the etch process for forming the primary gate patterns 107. The cleaning process may be performed using a wet or dry cleaning process using HF, NH$_4$OH or H$_2$SO$_4$, either alone or in combination. Byproducts are removed through the cleaning process, which can prohibit the occurrence of a bird's beak phenomenon of the dielectric layer 103 and the tunnel dielectric layer 101. At the time of the cleaning process, the gate electrode layer 105 is protected by the first passivation layer 108 and the sacrificial layer 109, so that an abnormal oxidization phenomenon can be prohibited.

Referring to FIG. 2C, the sacrificial layer 109 formed over the dielectric layer 103, the first passivation layer 108, the dielectric layer 103, the conductive layer for the floating gate 102, and the tunnel dielectric layer 101 are etched by an etch process, thus forming secondary gate patterns 108, 107, 103, 102, and 101. The sacrificial layer is removed in the etch process of the conductive layer for the floating gate 102. Consequently, a distance between the gates is widened and process margin of a subsequent process of gap-filling insulating material can be secured.

A second passivation layer 110 is formed on the entire surface including the secondary gate patterns 108, 107, 103, 102, and 101. The second passivation layer 110 may be formed from an HTO layer, an LP-TEOS layer or an ALD oxide layer. In the case in which the second passivation layer 110 is formed from the HTO layer, it is preferred that a mixed gas of silane-based gas, such as SiH$_4$, Si$_2$H$_6$ or SiH$_2$Cl$_2$, and O$_2$ gas be used.

The second passivation layer 110 and the first passivation layer 108 help to prohibit oxidization of the gate electrode layer 105 due to heat, which is generated in subsequent processes, so device characteristics can be improved.

Figure 3A:
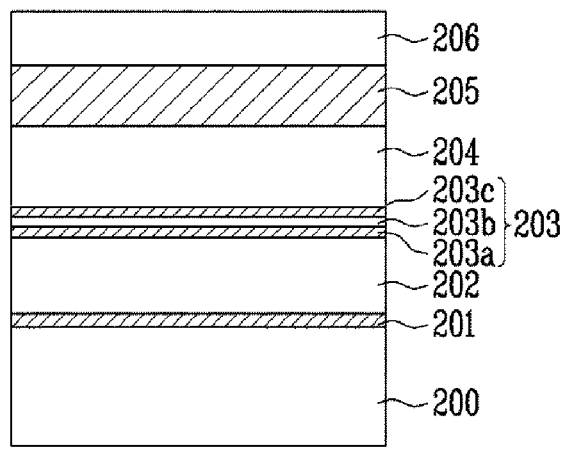
FIGS. 3A to 3C are sectional views illustrating a method of fabricating a semiconductor device in accordance with a second embodiment of the invention.
Figure 3B:
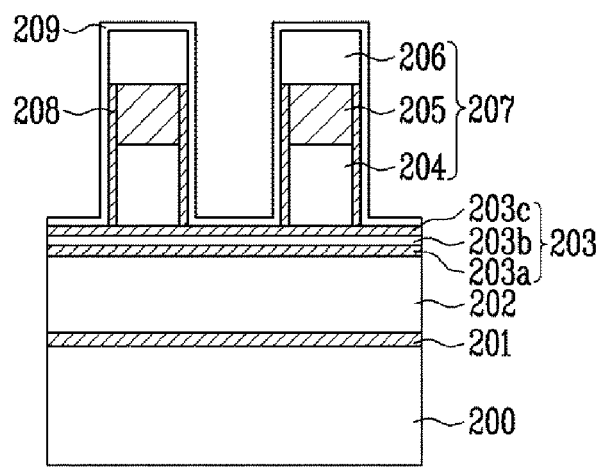
Figure 3C:
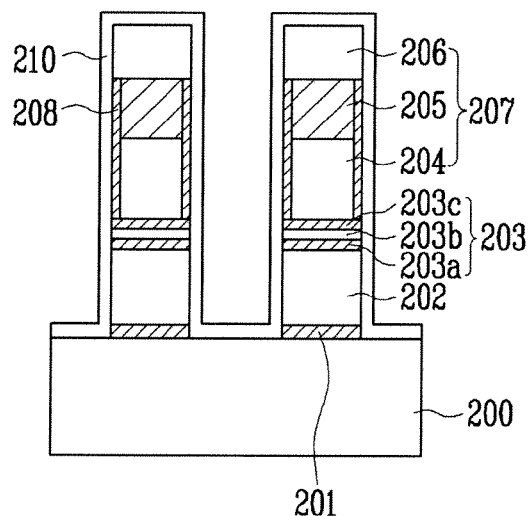

FIGS. 3A to 3C are sectional views illustrating a method of fabricating a semiconductor device in accordance with a second embodiment of the invention.

Referring to FIG. 3A, a tunnel dielectric layer 201, a conductive layer for a floating gate 202, a dielectric layer 203, a conductive layer for a control gate 204, a gate electrode layer 205, and a hard mask layer 206 are sequentially stacked over a semiconductor substrate 200.

The conductive layer for the floating gate 202 and the conductive layer for the control gate 204 may be formed from a polysilicon layer, and the dielectric layer 203 can have an ONO structure comprising a first oxide layer 203a, a nitride layer 203b, and a second oxide layer 203c. The gate electrode layer 205 may be formed from a tungsten (W) layer.

The conductive layer for the floating gate 202 is formed from a dual layer, including an amorphous polysilicon layer not containing an impurity and a polysilicon layer containing an impurity.

Although not shown in the drawings, after the conductive layer for the control gate 204 is formed, a diffusion-prevention layer may be formed before the gate electrode layer 205 is formed.

Referring to FIG. 3B, after photoresist pattern is formed on the hard mask layer 206, an etch process employing the photoresist pattern is performed. That is, the hard mask layer 206 is patterned.

The gate electrode layer 205 and the conductive layer for the control gate 204 are patterned by an etch process employing the patterned hard mask layer 206 as an etch mask, thereby forming primary gate patterns 207.

Next, a nitrification process is performed, and a first passivation layer 208 is formed on sidewalls of the gate electrode layer 205 and the conductive layer for the control gate 204, which have been exposed by the nitrification process. In other words, the first passivation layer 208 is formed by nitrifying the exposed sidewalls of the gate electrode layer 205 and the conductive layer for the control gate 204. The nitrification process may be performed using NH$_3$, N$_2$, NO, NO$_2$ gas, or a combination with an inert gas. A sacrificial layer 209 is formed on the entire surface including the first passivation layer 208. The sacrificial layer 209 may be formed from a polysilicon layer. The sacrificial layer 209 functions to prevent the first passivation layer 208 from being etched in a subsequent etch process of the dielectric layer 203. The sacrificial layer 209 may be formed using SiH$_4$, Si$_2$H$_6$, Si$_2$HCl$_2$, NH$_3$, N$_2$, Ar, He or PH$_3$ gas in a pressure range of 0.05 Torr to 760 Torr. Further, the sacrificial layer 209 preferably is formed using a laminar type in which the sacrificial layer 209 and the first passivation layer 208 are stacked alternately.

Next, a cleaning process may be performed to remove byproducts, which occur in the etch process for forming the primary gate patterns 207. The cleaning process preferably is performed using a wet or dry cleaning process, preferably using HF, NH$_4$OH, or H$_2$SO$_4$, either alone or in combination. Byproducts are removed through the cleaning process, which can prohibit the occurrence of a bird's beak phenomenon of the dielectric layer 203 and the tunnel dielectric layer 201. At the time of the cleaning process, the gate electrode layer 205 is protected by the first passivation layer 208 and the sacrificial layer 209, so that an abnormal oxidization phenomenon can be prohibited.

Referring to FIG. 3C, the sacrificial layer 209, the dielectric layer 203, the conductive layer for the floating gate 202, and the tunnel dielectric layer 201 are etched by an etch process, thus forming secondary gate patterns 208, 207, 203, 202, and 201. The sacrificial layer is removed in the etch process of the conductive layer for the floating gate 202. Consequently, a gate gap is widened and process margin of a subsequent process of gap-filling insulating material can be secured.

A second passivation layer 210 is formed on the entire surface including the secondary gate patterns 208, 207, 203, 202, and 201. The second passivation layer 210 preferably formed from an HTO layer, an LP-TEOS layer, or an ALD oxide layer. In the case in which the second passivation layer 210 is formed from the HTO layer, it is preferred that a mixed gas of silane-based gas, such as SiH$_4$, Si$_2$H$_6$ or SiH$_2$Cl$_2$, and O$_2$ gas be used.

The second passivation layer 210 and the first passivation layer 208 help to prohibit oxidization of the gate electrode layer 205 due to heat, which is generated in subsequent processes, so device characteristics can be improved.

Figure 4A:
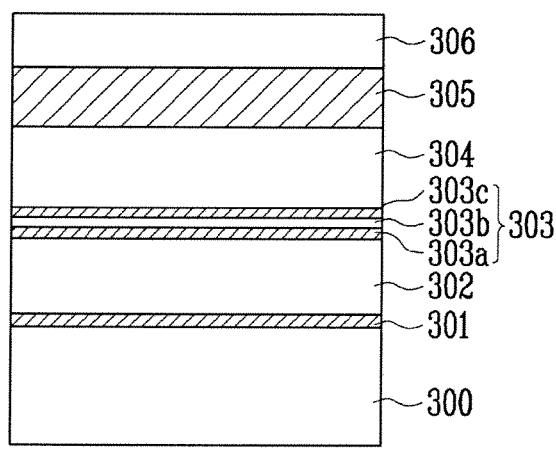
FIGS. 4A to 4C are sectional views illustrating a method of fabricating a semiconductor device in accordance with a third embodiment of the invention.
Figure 4B:
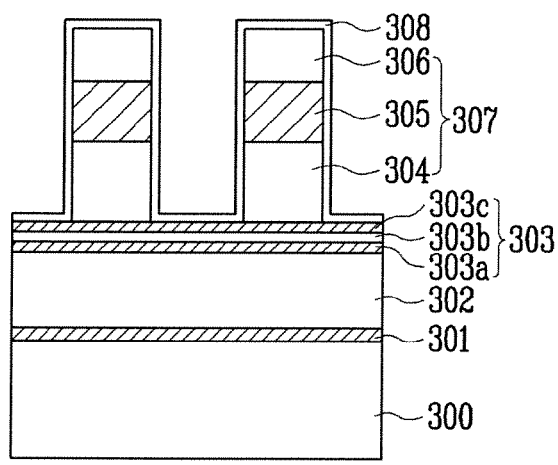
Figure 4C:
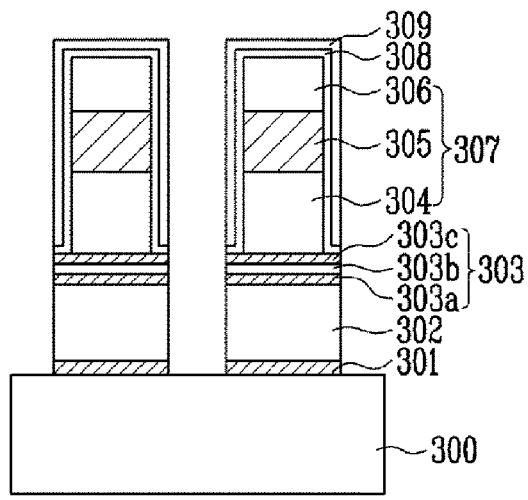

FIGS. 4A to 4C are sectional views illustrating a method of fabricating a semiconductor device in accordance with a third embodiment of the invention.

Referring to FIG. 4A, a tunnel dielectric layer 301, a conductive layer for a floating gate 302, a dielectric layer 303, a conductive layer for a control gate 304, a gate electrode layer 305, and a hard mask layer 306 are sequentially stacked over a semiconductor substrate 300.

The conductive layer for the floating gate 302 and the conductive layer for the control gate 304 preferably are formed from a polysilicon layer, and the dielectric layer 303 preferably has an ONO structure comprising a first oxide layer 303a, a nitride layer 303b, and a second oxide layer 303c. The gate electrode layer 305 preferably is formed from a tungsten (W) layer.

The conductive layer for the floating gate 302 preferably is formed from a dual layer, including an amorphous polysilicon layer not containing an impurity and a polysilicon layer containing an impurity.

Although not shown in the drawings, after the conductive layer for the control gate 304 is formed, a diffusion-prevention layer may be formed before the gate electrode layer 305 is formed.

Referring to FIG. 4B, after photoresist pattern is formed on the hard mask layer 306, an etch process employing the photoresist pattern is performed. That is, the hard mask layer 306 is patterned.

The gate electrode layer 305 and the conductive layer for the control gate 304 are patterned by an etch process employing the patterned hard mask layer 306 as an etch mask, thereby forming primary gate patterns 307.

An oxidization process preferably is performed to form a first passivation layer 308 on the entire surface including the primary gate patterns 307. The oxidization process preferably is performed using $O_2$ or $H_2$ gas, or a combination thereof. It may be preferred that etch-damaged portions be cured while not oxidizing the exposed gate electrode layer 305 by further adding an inert gas of $N_2$ or Ar gas. The first passivation layer 308 may be formed from a nitride layer using a nitride layer deposition process instead of the oxidization process.

Referring to FIG. 4C, a second passivation layer 309 is formed on the entire surface including the first passivation layer 308. The second passivation layer 309 preferably is formed from an HTO layer, an LP-TEOS layer, or an ALD oxide layer. In the case in which the second passivation layer 309 is formed from the HTO layer, it is preferred that a mixed gas of silane-based gas, such as $SiH_4$, $Si_2H_6$ or $SiH_2Cl_2$, and $O_2$ gas be used. A sacrificial layer 310 is formed on the entire surface including the second passivation layer 309. The sacrificial layer 310 preferably is formed from a polysilicon layer. The sacrificial layer 310 functions to prevent the second passivation layer 309 from being etched in a subsequent etch process of the dielectric layer 303. The sacrificial layer 310 preferably is formed using $SiH_4$, $Si_2H_6$, $Si_2HCl_2$, $NH_3$, $N_2$, Ar, He or $PH_3$ gas, preferably in a pressure range of 0.05 Torr to 760 Torr.

Next, a cleaning process may be performed to remove byproducts, which occur in the etch process for forming the primary gate patterns 307. The cleaning process preferably is performed using a wet or dry cleaning process, preferably using HF, $NH_4OH$ or $H_2SO_4$, either alone or in combination. Byproducts are removed through the cleaning process, which can prohibit the occurrence of a bird's beak phenomenon of the dielectric layer 303 and the tunnel dielectric layer 301. The cleaning process preferably is performed after the first passivation layer 308 is formed.

Next, the sacrificial layer 310, the second passivation layer 309, and the first passivation layer 308, which are formed over the dielectric layer 303, the dielectric layer 303, the conductive layer for the floating gate 302, and the tunnel dielectric layer 301 are etched by an etch process, thus forming secondary gate patterns 309, 308, 307, 303, 302, and 301. The sacrificial layer is removed in the etch process of the conductive layer for the floating gate 302, so that a distance between gate patterns is increased and process margin of a subsequent process of gap-filling insulating material can be secured.

The second passivation layer 309 and the first passivation layer 308 help to prohibit oxidization of the gate electrode layer 305 due to heat, which is generated in subsequent processes, so device characteristics can be improved.

Figure 5A:
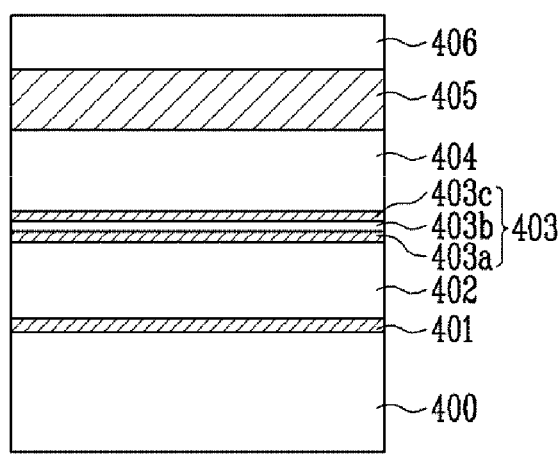
FIGS. 5A to 5C are sectional views illustrating a method of fabricating a semiconductor device in accordance with a fourth embodiment of the invention.
Figure 5B:
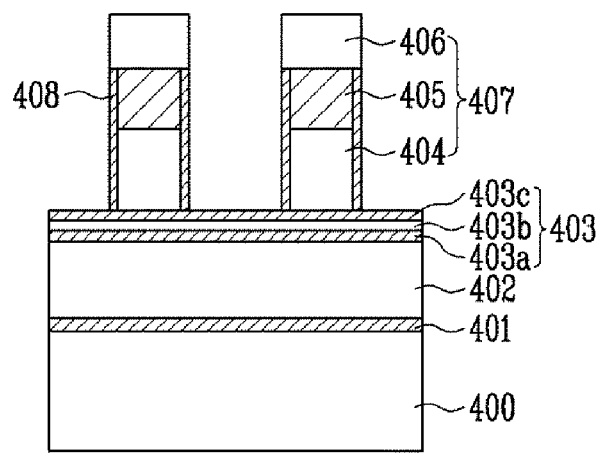
Figure 5C:
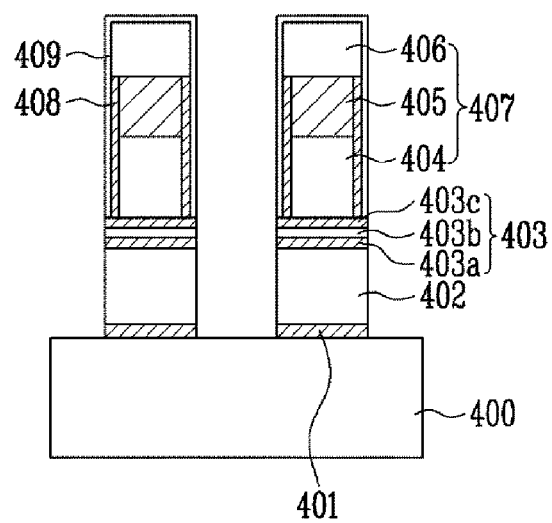

FIGS. 5A to 5C are sectional views illustrating a method of fabricating a semiconductor device in accordance with a fourth embodiment of the invention.

Referring to FIG. 5A, a tunnel dielectric layer 401, a conductive layer for a floating gate 402, a dielectric layer 403, a conductive layer for a control gate 404, a gate electrode layer 405, and a hard mask layer 406 are sequentially stacked over a semiconductor substrate 400.

The conductive layer for the floating gate 402 and the conductive layer for the control gate 404 preferably are formed from a polysilicon layer, and the dielectric layer 403 preferably has an ONO structure comprising a first oxide layer 403a, a nitride layer 403b, and a second oxide layer 403c. The gate electrode layer 405 preferably is formed from a tungsten (W) layer.

The conductive layer for the floating gate 402 preferably is formed from a dual layer, including an amorphous polysilicon layer not containing an impurity and a polysilicon layer containing an impurity.

Although not shown in the drawings, after the conductive layer for the control gate 404 is formed, a diffusion-prevention layer may be formed before the gate electrode layer 405 is formed.

Referring to FIG. 5B, after photoresist pattern is formed on the hard mask layer 406, an etch process employing the photoresist pattern is performed. That is, the hard mask layer 406 is patterned.

The gate electrode layer 405 and the conductive layer for the control gate 404 are patterned by an etch process employing the patterned hard mask layer 406 as an etch mask, thereby forming primary gate patterns 407.

A first passivation layer 408 is then formed on sidewalls of the gate electrode layer 405 and the conductive layer for the control gate 404, which are exposed by performing a nitrification process. That is, the first passivation layer 408 preferably is formed by nitrifying the exposed sidewalls of the gate electrode layer 405 and the conductive layer for the control gate 404. The nitrification process preferably is performed using $NH_3$ gas, $N_2$ gas, NO gas, or $NO_2$ gas, or a combination thereof with an inert gas.

Next, a cleaning process preferably is performed to remove byproducts, which occur in the etch process for forming the primary gate patterns 407. The cleaning process preferably is performed using a wet or dry cleaning process, preferably using HF, $NH_4OH$ or $H_2SO_4$, either alone or in combination. Byproducts are removed through the cleaning process, which can prohibit the occurrence of a bird's beak phenomenon of the dielectric layer 403 and the tunnel dielectric layer 401. At the time of the cleaning process, the first passivation layer 408 protects damage to the gate electrode layer 405 due to a cleaning agent.

Referring to FIG. 5C, a second passivation layer 409 is formed on the entire surface including the first passivation layer 408. The second passivation layer 409 preferably is formed from an HTO layer, an LP-TEOS layer, or an ALD oxide layer. In the case in which the second passivation layer 409 is formed from the HTO layer, it is preferred that a mixed gas of silane-based gas, such as $SiH_4$, $Si_2H_6$ or $SiH_2Cl_2$, and $O_2$ gas be used. Next, a sacrificial layer 410 is formed on the entire surface including the second passivation layer 409. The sacrificial layer 410 preferably is formed from a polysilicon layer. The sacrificial layer 410 functions to prevent the second passivation layer 409 from being etched in a subsequent etch process of the dielectric layer 403. The sacrificial layer 410 preferably is formed using $SiH_4$, $Si_2H_6$, $Si_2HCl_2$, $NH_3$, $N_2$, Ar, He or $PH_3$ gas, preferably in a pressure range of 0.05 Torr to 760 Torr. Further, the sacrificial layer 410 preferably is formed using a laminar type in which the sacrificial layer 410 and the first passivation layer 408 are stacked alternately.

Thereafter, the sacrificial layer 410, the second passivation layer 409, and the first passivation layer 408 formed over the dielectric layer 403, the dielectric layer 403, the conductive layer for the floating gate 402, and the tunnel dielectric layer 401 are etched by an etch process, thus forming secondary gate patterns 409, 408, 407, 403, 402, and 401. The sacrificial layer 410 is removed in the etch process of the conductive layer for the floating gate 402. Consequently, a distance between the gates is widened and process margin of a subsequent process of gap-filling insulating material can be secured.

The second passivation layer 409 and the first passivation layer 408 help to prohibit oxidization of the gate electrode layer 405 due to heat, which is generated in subsequent processes, so device characteristics can be improved.

Figure 6A:
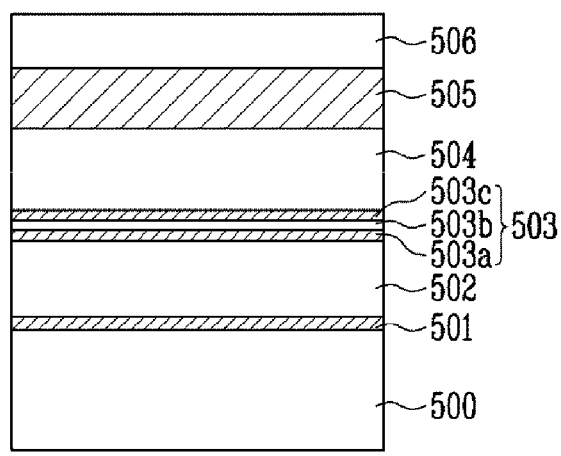
FIGS. 6A to 6C are sectional views illustrating a method of fabricating a semiconductor device in accordance with a fifth embodiment of the invention.
Figure 6B:
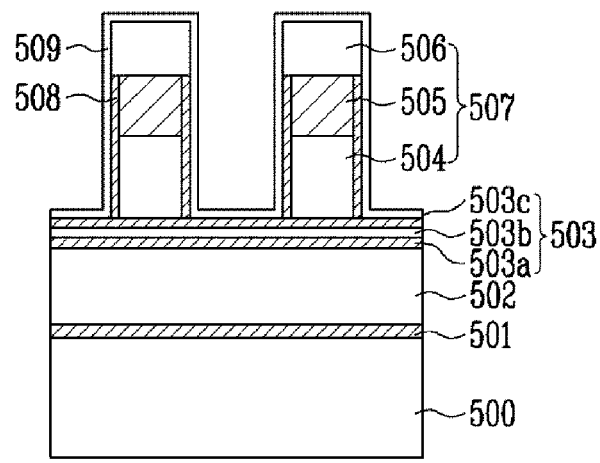
Figure 6C:
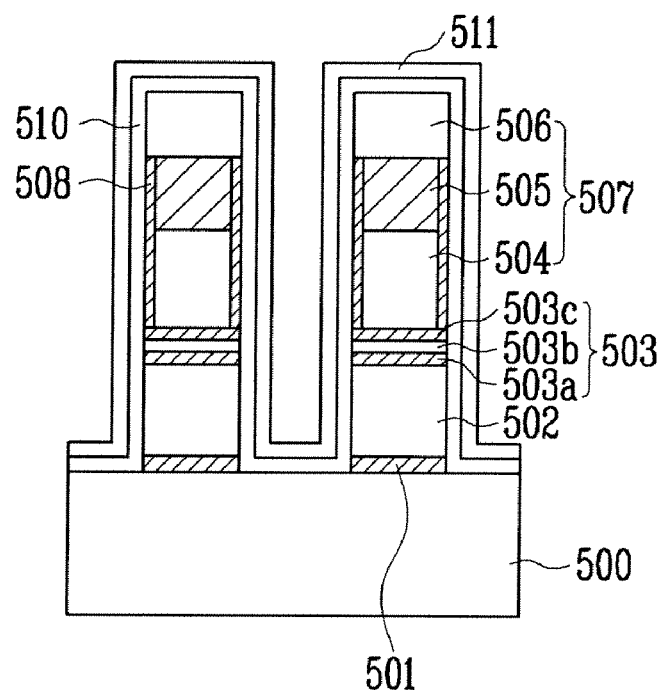

FIGS. 6A to 6C are sectional views illustrating a method of fabricating a semiconductor device in accordance with a fifth embodiment of the invention.

Referring to FIG. 6A, a tunnel dielectric layer 501, a conductive layer for a floating gate 502, a dielectric layer 503, a conductive layer for a control gate 504, a gate electrode layer 505, and a hard mask layer 506 are sequentially stacked over a semiconductor substrate 500.

The conductive layer for the floating gate 502 and the conductive layer for the control gate 504 preferably are formed from a polysilicon layer, and the dielectric layer 503 preferably has an ONO structure comprising a first oxide layer 503a, a nitride layer 503b, and a second oxide layer 503c. The gate electrode layer 505 preferably is formed from a tungsten (W) layer.

The conductive layer for the floating gate 502 preferably is formed from a dual layer, including an amorphous polysilicon layer not containing an impurity and a polysilicon layer containing an impurity.

Although not shown in the drawings, after the conductive layer for the control gate 504 is formed, a diffusion-prevention layer may be formed before the gate electrode layer 505 is formed.

Referring to FIG. 6B, after photoresist pattern is formed on the hard mask layer 506, an etch process employing the photoresist pattern is performed. That is, the hard mask layer 506 is patterned.

The gate electrode layer 505 and the conductive layer for the control gate 504 are patterned by an etch process employing the patterned hard mask layer 506 as an etch mask, thereby forming primary gate patterns 507.

A first passivation layer 508 is then formed on sidewalls of the gate electrode layer 505 and the conductive layer for the control gate 504, which are exposed, preferably by performing a nitrification process. That is, the first passivation layer 508 is formed by nitrifying the exposed sidewalls of the gate electrode layer 505 and the conductive layer for the control gate 504. The nitrification process preferably is performed using $NH_3$ gas, $N_2$ gas, NO gas, $NO_2$ gas, or a combination thereof with an inert gas. Next, a sacrificial layer 509 is formed on the entire surface including the first passivation layer 508. The sacrificial layer 509 may be formed from a polysilicon layer. The sacrificial layer 509 functions to prevent the first passivation layer 508 from being etched in a subsequent etch process of the dielectric layer. The sacrificial layer 509 preferably is formed using $SiH_4$, $Si_2H_6$, $Si_2HCl_2$, $NH_3$, $N_2$, Ar, He or $PH_3$ gas, preferably in a pressure range of 0.05 Torr to 760 Torr. Further, the sacrificial layer 509 preferably is formed using a laminar type in which the sacrificial layer 509 and the first passivation layer 508 are stacked alternately.

Next, a cleaning process preferably is performed to remove byproducts, which occur in the etch process for forming the primary gate patterns 507. The cleaning process preferably is performed using a wet or dry cleaning process, preferably using HF, $NH_4OH$ or $H_2SO_4$, either alone or in combination. Byproducts are removed through the cleaning process, which can prohibit the occurrence of a bird's beak phenomenon of the dielectric layer 503 and the tunnel dielectric layer 501. At the time of the cleaning process, the first passivation layer 508 protects damage to the gate electrode layer 505 due to a cleaning agent.

Referring to FIG. 6C, the sacrificial layer, the dielectric layer 503, the conductive layer for the floating gate 502, and the tunnel dielectric layer 501 are etched by an etch process, thus forming secondary gate patterns 508, 507, 503, 502, and 501. The sacrificial layer is removed in the etch process of the conductive layer for the floating gate 502. Consequently, a distance between the gates is widened and process margin of a subsequent process of gap-filling insulating material can be secured.

Next, an oxidization process is performed to form a second passivation layer 510 on the entire surface including the secondary gate patterns 507. The oxidization process preferably is performed using $O_2$ gas or $H_2$ gas, or a combination. It may be preferred that etch-damaged portions be cured while not oxidizing the exposed gate electrode layer 505 by further adding an inert gas of $N_2$ or Ar gas.

A third passivation layer 511 is formed on the entire surface including the second passivation layer 510. The third passivation layer 511 preferably is formed from an HTO layer, an LP-TEOS layer, or an ALD oxide layer. In the case in which the third passivation layer 511 is formed from the HTO layer, it is preferred that a mixed gas of silane-based gas, such as $SiH_4$, $Si_2H_6$ or $SiH_2Cl_2$, and $O_2$ gas be used.

The first to third passivation layers 508, 510, and 511 help to prohibit oxidization of the gate electrode layer 505 due to heat, which is generated in subsequent processes, so device characteristics can be improved.

In accordance with the embodiments of the invention, in a process of forming a gate pattern of a semiconductor device, after a gate electrode layer is patterned, a passivation layer is formed on sidewalls of the gate electrode layer. Accordingly, the sidewalls of the gate electrode layer can be prevented from being exposed, and etch damage to the gate electrode layer in a subsequent etch process of gate patterns and etch damage at the time of a cleaning process can be prevented. Consequently, device failure can be reduced.

Further, the passivation layer is formed of a dual layer of an oxide layer and a nitride layer. Accordingly, the gate electrode layer can be prevented from being exposed due to damaged passivation layer at the time of a subsequent etch process of a dielectric layer.

The embodiments disclosed herein have been proposed to allow a person skilled in the art to easily implement the invention, and the person skilled in the part may implement the invention by a combination of these embodiments. Therefore, the scope of the invention is not limited by or to the embodiments as described above, and should be construed to be defined only by the appended claims and their equivalents.

What is claimed is:

1. A method of fabricating a semiconductor device, comprising:
   sequentially stacking a tunnel dielectric layer, a first conductive layer, a dielectric layer, a second conductive layer, and a gate electrode layer over a semiconductor substrate;
   patterning the gate electrode layer and the second conductive layer;
   forming a first passivation layer on sidewalls of a patterned gate electrode layer;
   forming a sacrificial layer on an entire surface including the first passivation layer; and forming gate patterns by etching the sacrificial layer, dielectric layer, the first conductive layer, and the tunnel dielectric layer, which had been exposed by the patterned gate electrode layer.

2. The method of claim 1, further comprising, before forming the gate patterns, performing a cleaning process to remove byproducts occurring upon patterning of the gate electrode layer and the second conductive layer.

3. The method of claim 2, wherein the cleaning process is performed using a wet cleaning process or a dry cleaning process in either case employing HF, $NH_4OH$, or $H_2SO_4$, either alone or in combination.

4. The method of claim 1, wherein the first passivation layer is formed by an oxidization process, a nitrification process, or a nitride layer deposition process.

5. The method of claim 4, wherein the oxidization process is performed by using $O_2$ gas or $H_2$ gas, either alone or in combination, and by further adding at least one inert gas selected from the group consisting of $N_2$ gas and Ar gas.

6. The method of claim 4, wherein the nitrification process is performed by using $NH_3$, $N_2$, NO, $NO_2$ gas, or a combination, with an inert gas.

7. The method of claim 1, wherein the sacrificial layer is formed of a polysilicon layer.

8. The method of claim 1, wherein the sacrificial layer is removed in a process of forming the gate patterns.

9. The method of claim 1, wherein the sacrificial layer is formed by using $SiH_4$, $Si_2H_6$, $Si_2HCl_2$, $NH_3$, $N_2$, Ar, He or $PH_3$ gas in a pressure range of 0.05 Torr to 760 Torr.

10. The method of of claim 1 further comprising:
    forming a second passivation layer on the entire surface including the first passivation layer before forming the sacrificial layer.

11. The method of claim 10, wherein the second passivation layer is formed of a high-temperature oxide (HTO) layer, a low-pressure tetraethyl orthosilicate (LP-TEOS) layer, or an atomic layer deposition (ALD) oxide layer.

12. The method of claim 11, wherein the HTO layer is formed by using a mixed gas comprising $O_2$ gas and a silane-based gas selected from the group consisting of $SiH_4$ gas, $Si_2H_6$ gas, and $SiH_2Cl_2$ gas.

13. The method of claim 1 further comprising forming a second passivation layer on the entire surface along a surface of the gate patterns including the first passivation layer.

14. The method of claim 13, wherein the second passivation layer is formed of a high-temperature oxide (HTO) layer, a low-pressure tetraethyl orthosilicate (LP-TEOS) layer, or an atomic layer deposition (ALD) oxide layer.

15. The method of claim 14, wherein the HTO layer is formed by using a mixed gas of $O_2$ gas and a silane-based gas selected from the group consisting of $SiH_4$ gas, $Si_2H_6$ gas, and $SiH_2Cl_2$ gas.

16. The method of claim 1 further comprising:
    forming second and third passivation layers on the entire surface along a surface of the gate patterns including the first passivation layer.

17. The method of claim 16, wherein the first passivation layer is formed by a nitrification process using $NH_3$, gas, $N_2$ gas, NO gas, or $NO_2$ gas, or a combination with an inert gas.

18. The method of claim 16, wherein the second passivation layer is formed by an oxidization process using $O_2$ gas or $H_2$ gas, either alone or in combination and by further adding an inert gas selected from the group consisting of $N_2$ and Ar gas.

19. The method of claim 16, wherein the third passivation layer is formed of a high-temperature oxide (HTO) layer, a low-pressure tetraethyl orthosilicate (LP-TEOS) layer, or an atomic layer deposition (ALD) oxide layer.

20. The method of claim 19, wherein the HTO layer is formed by using a mixed gas of $O_2$ gas and a silane-based gas selected from the group consisting of $SiH_4$ gas, $Si_2H_6$ gas, and $SiH_2Cl_2$ gas.

* * * * *